US012610659B2

(12) United States Patent
Vaskin et al.

(10) Patent No.: US 12,610,659 B2
(45) Date of Patent: Apr. 21, 2026

(54) SEMICONDUCTOR LIGHT-EMITTING DEVICE WITH NEAR-FIELD MULTI-LAYER REFLECTOR

(71) Applicant: Lumileds LLC, San Jose, CA (US)

(72) Inventors: Aleksandr Vaskin, Eindhoven (NL); Mohamed S. Abdelkhalik, Eindhoven (NL); Debapriya Pal, Amsterdam (NL); Jaime Gomez Rivas, Eindhoven (NL); Albert Femius Koenderink, Amsterdam (NL); Toni Lopez, Aachen (DE); Aimi Abass, Aachen (DE)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 692 days.

(21) Appl. No.: 17/879,948

(22) Filed: Aug. 3, 2022

(65) Prior Publication Data

US 2023/0051992 A1 Feb. 16, 2023

Related U.S. Application Data

(60) Provisional application No. 63/232,960, filed on Aug. 13, 2021.

(51) Int. Cl.
*H01L 33/60* (2010.01)
*H01L 27/15* (2006.01)
(Continued)

(52) U.S. Cl.
CPC .......... *H10H 20/814* (2025.01); *H10H 20/01* (2025.01); *H10H 20/84* (2025.01); *H10H 20/857* (2025.01); *H10H 20/0364* (2025.01)

(58) Field of Classification Search
CPC .. H10H 20/841; H10H 20/855; H10H 20/856; H10H 20/84; H10H 20/872;
(Continued)

(56) References Cited

U.S. PATENT DOCUMENTS

2007/0152230 A1* 7/2007 Duong ................. H10F 39/804
257/E33.072
2008/0179605 A1* 7/2008 Takase .............. H10H 20/8142
257/E33.068
(Continued)

FOREIGN PATENT DOCUMENTS

CN 110783439 A 2/2020
CN 116190516 A * 5/2023
(Continued)

OTHER PUBLICATIONS

Zhao, H., Arneson, C.E., Fan, D. et al. Stable blue phosphorescent organic LEDs that use polariton-enhanced Purcell effects. Nature 626, 300-305 (2024). https://doi.org/10.1038/s41586-023-06976-8 (Year: 2024).*
(Continued)

*Primary Examiner* — Ajay Ojha
*Assistant Examiner* — Tsz K Chiu

(57) ABSTRACT

A light-emitting device includes a semiconductor diode structure and a multi-layer reflector (MLR) structure. The diode structure includes first and second doped semiconductor layers and an active layer between them; the active layer emits output light at a nominal emission vacuum wavelength $\lambda_0$ to propagate within the diode structure. The MLR structure is positioned against a back surface of the second semiconductor layer, includes two or more layers of dielectric materials of two or more different refractive indices, reflects incident output light within the diode structure, and is in near-field proximity to the active layer relative to $\lambda_0$. At least a portion of the output light, propagating perpendicularly within the diode structure relative to a device exit surface, exits the diode structure as device output light. The MLR structure can include scattering elements that scatter
(Continued)

some laterally propagating output light to propagate perpendicularly.

20 Claims, 7 Drawing Sheets

(51) Int. Cl.

| | |
|---|---|
| *H10H 20/01* | (2025.01) |
| *H10H 20/814* | (2025.01) |
| *H10H 20/84* | (2025.01) |
| *H10H 20/857* | (2025.01) |

(58) Field of Classification Search
CPC .... H10H 20/814; H10H 20/819; H10H 20/01; H10H 20/034; H10H 20/0363; H10H 29/142; H10H 20/833; H10H 20/8515; H10H 20/825; H10H 20/82; H10H 20/821; H10H 20/882; H10H 20/831; H10H 20/835; H10H 20/8514; H10H 20/0137; H10H 20/018; H10H 20/0361; H10H 20/0362; H10H 20/8142; H10H 20/8312; H10H 20/852; H10H 20/857; H10H 20/862; H10H 29/14; H10H 20/813; H10H 20/8314; H10H 20/8512; H10H 20/8516; H10H 29/30; H10H 20/032; H10H 20/0364; H10H 20/81; H10H 20/8162; H10H 20/8316; H10H 20/8506; H10H 29/012; H10H 29/0363; H10H 29/0364; H10H 29/24; H10H 29/37; H10H 29/49; H10H 29/8552; H10H 29/856; H10H 29/882
See application file for complete search history.

(56) References Cited

U.S. PATENT DOCUMENTS

| | | | | |
|---|---|---|---|---|
| 2010/0140637 A1* | 6/2010 | Donofrio | ............. | H10H 20/833 |
| | | | | 257/E33.023 |
| 2010/0213485 A1* | 8/2010 | McKenzie | ........... | H10H 20/819 |
| | | | | 257/E33.013 |
| 2011/0316026 A1* | 12/2011 | Kim | ..................... | H10H 20/814 |
| | | | | 257/E33.072 |
| 2012/0018755 A1 | 1/2012 | Speck et al. | | |
| 2013/0320301 A1 | 12/2013 | Seo et al. | | |
| 2014/0008676 A1 | 1/2014 | Wang et al. | | |
| 2015/0001568 A1 | 1/2015 | Desieres et al. | | |
| 2017/0110626 A1 | 4/2017 | Jorgenson | | |
| 2019/0019921 A1 | 1/2019 | Hoppel | | |
| 2021/0184081 A1 | 6/2021 | Lopez-Julia et al. | | |
| 2021/0336090 A1* | 10/2021 | Yang | ................... | H10H 29/142 |
| 2022/0029056 A1 | 1/2022 | Varghese et al. | | |

FOREIGN PATENT DOCUMENTS

| | | |
|---|---|---|
| KR | 101731857 B1 | 5/2017 |
| WO | 2020/115226 A1 | 6/2020 |

OTHER PUBLICATIONS

Lu et al., "Recent Progress on GaN-based Vertical Cavity Surface Emitting Lasers", SPIE Smart Structures and Materials + Nondestuctive Evaluation and Health Monitoring, 2005, San Diego California, United States, vol. 6766, Sep. 25, 2007, 12 pages.

From the EPO as the International Searching Authority, Notification of Transmittal of the International Search Report and the Written Opinion of the International Searching Authority or the Declaration, PCT/US2022/039377, Nov. 28, 2022, 13 pages.

Zhang et al., "Improved emission of GaN-LED based on optimized multilayered lamellar micro-gratings", Journal of Luminescence, vol. 192, Jul. 17, 2017, 8 pages.

* cited by examiner

—311
—314
—312
—309
—320d
—320c
—320b
—320a
—305

| layer | material | thickness |
|---|---|---|
| 311 | n-GaN | > 1 μm |
| 314 | MQWs | 50 nm |
| 312 | p-GaN | 50 nm |
| 309 | ITO | 20 nm |
| 320d | NbO$_x$ | 20 nm |
| 320c | SiO$_2$ | 80 nm |
| 320b | NbO$_x$ | 45 nm |
| 320a | SiO$_2$ | 45 nm |
| 305 | Ag | > 100 nm |

| | 5A | 10 | 11 |
|---|---|---|---|
| Purcell factor | 1.044 | 1.077 | 1.009 |
| radiation efficiency | 0.975 | 0.967 | 0.986 |
| total radiated emission | 1.018 | 1.041 | 0.994 |
| tot. rad. em. (24.2°) | 0.133 | 0.125 | 0.110 |
| tot. rad. em. (46.8°) | 0.394 | 0.495 | 0.404 |

FIG. 6A
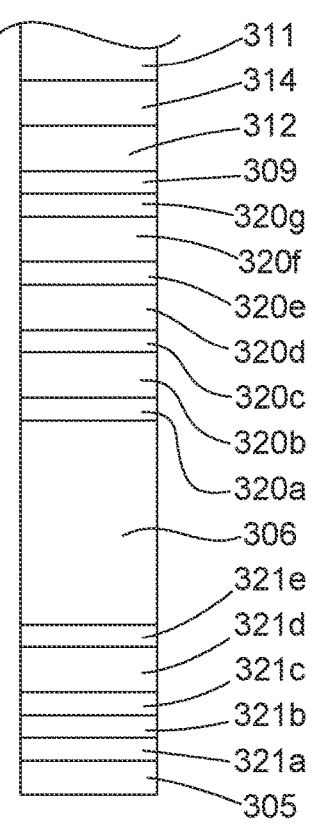
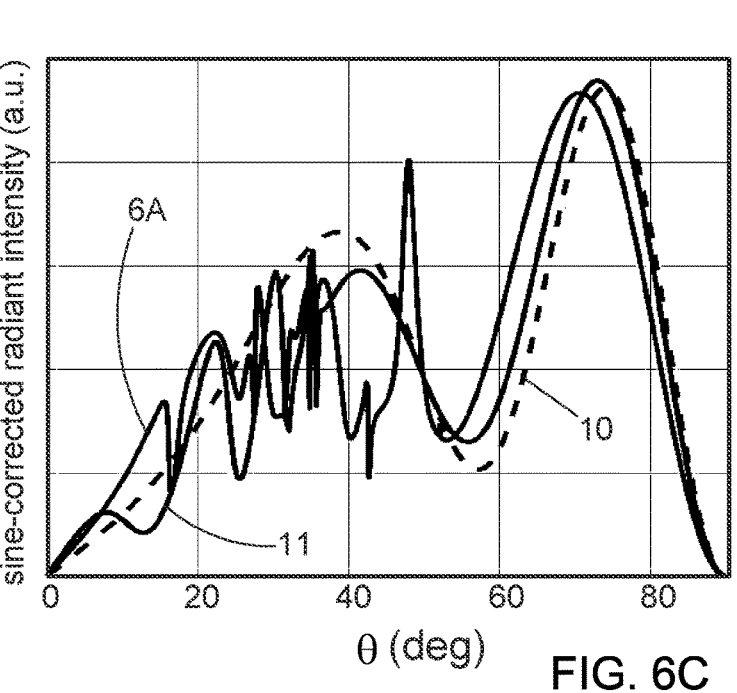
FIG. 6C
| layer | material | thickness | layer | material | thickness |
|-------|----------|-----------|-------|----------|-----------|
| 311 | n-GaN | > 1 μm | 320b | SiO₂ | 98.4 nm |
| 314 | MQWs | 50 nm | 320a | NbOₓ | 63.3 nm |
| 312 | p-GaN | 50 nm | 306 | SiO₂ | 485.7 nm |
| 309 | ITO | 20 nm | 321e | NbOₓ | 52.5 nm |
| 320g | NbOₓ | 18.3 nm | 321d | SiO₂ | 98.8 nm |
| 320f | SiO₂ | 71.8 nm | 321c | NbOₓ | 51.7 nm |
| 320e | NbOₓ | 47.6 nm | 321b | SiO₂ | 40.8 nm |
| 320d | SiO₂ | 87.1 nm | 321a | AlOₓ | 22.5 nm |
| 320c | NbOₓ | 17.5 nm | 305 | Ag | >100 nm |
FIG. 6B
| | 6A | 10 | 11 |
|---|-----|-----|-----|
| Purcell factor | 1.0356 | 1.077 | 1.009 |
| radiation efficiency | 0.9876 | 0.967 | 0.986 |
| total radiated emission | 1.022759 | 1.041 | 0.994 |
| tot. rad. em. (24.2°) | 0.1509 | 0.125 | 0.11 |
| tot. rad. em. (46.8°) | 0.3942 | 0.495 | 0.404 |
FIG. 6D

FIG. 7A
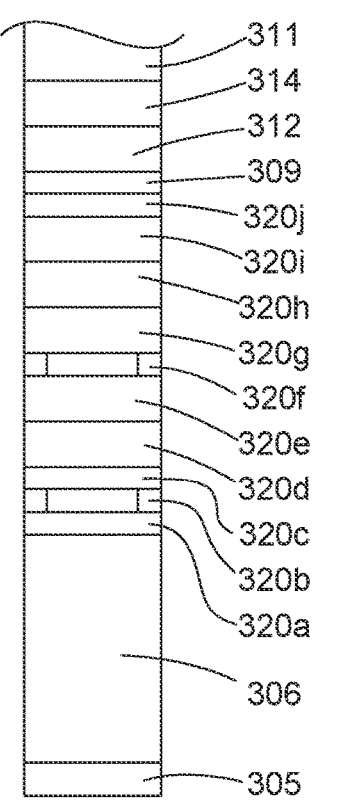
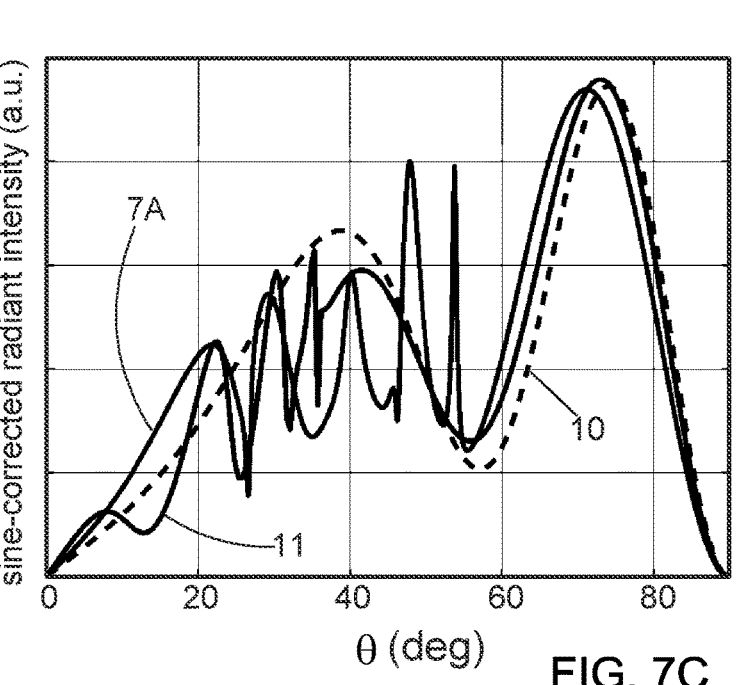
FIG. 7C
| layer | material | thickness | layer | material | thickness |
|-------|----------|-----------|-------|----------|-----------|
| 311 | n-GaN | > 1 μm | 320f | $TiO_2/SiO_2$ | 25 nm |
| 314 | MQWs | 50 nm | 320e | $TiO_2$ | 50 nm |
| 312 | p-GaN | 50 nm | 320d | $SiO_2$ | 50 nm |
| 309 | ITO | 20 nm | 320c | $TiO_2$ | 25 nm |
| 320j | $TiO_2$ | 25 nm | 320b | $TiO_2/SiO_2$ | 25 nm |
| 320i | $SiO_2$ | 50 nm | 320a | $TiO_2$ | 25 nm |
| 320h | $TiO_2$ | 50 nm | 306 | $SiO_2$ | 205 nm |
| 320g | $SiO_2$ | 50 nm | 305 | Ag | >100 nm |
FIG. 7B
|  | 7A | 10 | 11 |
|--|-----|-----|-----|
| Purcell factor | 1.050 | 1.065 | 1.013 |
| radiation efficiency | 0.983 | 0.960 | 0.983 |
| total radiated emission | 1.032 | 1.023 | 0.996 |
| tot. rad. em. (24.2°) | 0.160 | 0.107 | 0.112 |
| tot. rad. em. (46.8°) | 0.393 | 0.477 | 0.408 |
FIG. 7D

| layer | material | thickness |
|-------|----------|-----------|
| 311 | n-GaN | > 1 µm |
| 314 | MQWs | 50 nm |
| 312 | p-GaN | 50 nm |
| 309 | ITO | 20 nm |
| 320b | TiO$_2$/SiO$_2$ | 60 nm |
| 320a | TiO$_2$ | 70 nm |
| 305 | Ag | > 100 nm |

| | 8A | 10 | 11 |
|---|-----|-----|-----|
| Purcell factor | 1.005 | 1.077 | 1.009 |
| radiation efficiency | 0.955 | 0.967 | 0.986 |
| total radiated emission | 0.959 | 1.041 | 0.994 |
| tot. rad. em. (24.2°) | 0.170 | 0.125 | 0.110 |
| tot. rad. em. (46.8°) | 0.376 | 0.495 | 0.404 |

θ (deg)

| layer | material | thickness |
|-------|----------|-----------|
| 311 | n-GaN | > 1 μm |
| 314 | MQWs | 50 nm |
| 312 | p-GaN | 50 nm |
| 309 | ITO | 20 nm |
| 320b | $TiO_2$ | 70 nm |
| 320a | $TiO_2/SiO_2$ | 60 nm |
| 306 | $SiO_2$ | 200 nm |
| 305 | Ag | > 100 nm |

|  | 9A | 10 | 11 |
|--|----|----|----|
| Purcell factor | 1.033 | 1.077 | 1.009 |
| radiation efficiency | 0.969 | 0.967 | 0.986 |
| total radiated emission | 1.002 | 1.041 | 0.994 |
| tot. rad. em. (24.2°) | 0.142 | 0.125 | 0.110 |
| tot. rad. em. (46.8°) | 0.424 | 0.495 | 0.404 |

SEMICONDUCTOR LIGHT-EMITTING DEVICE WITH NEAR-FIELD MULTI-LAYER REFLECTOR

RELATED APPLICATION

This application claims benefit of U.S. provisional App. No. 63/232,960 entitled "Semiconductor light-emitting device with near-field multi-layer reflector" filed Aug. 13, 2021 in the names of Vaskin et al, said provisional application being incorporated by reference as if set forth herein in its entirety.

FIELD OF THE INVENTION

The field of the present invention relates to semiconductor light-emitting devices. In particular, a semiconductor light-emitting device is disclosed that includes a near-field multi-layer reflector.

SUMMARY

An inventive semiconductor light-emitting device comprises a semiconductor diode structure and a multi-layer reflector (MLR) structure. The semiconductor diode structure includes first and second doped semiconductor layers and an active layer between a back surface of the first semiconductor layer and a front surface of the second semiconductor layer. The active layer emits output light, resulting from electrical current flow through the device, at a nominal emission vacuum wavelength $\lambda_0$ to propagate within the diode structure. The MLR structure is positioned against a back surface of the second semiconductor layer, and includes layers of dielectric materials of two or more different refractive indices. The MLR structure reflects output light incident thereon from within the second semiconductor layer. The second semiconductor layer is sufficiently thin so that the MLR structure is in near-field proximity to the active layer relative to the vacuum wavelength $\lambda_0$. At least a portion of a front surface of the first semiconductor layer is arranged as a device exit surface through which at least a portion of the output light, propagating perpendicularly within the diode structure relative to the device exit surface and incident on the device exit surface within the diode structure, exits the diode structure as device output light.

An inventive light-emitting device can further include a metal layer on a back surface of the MLR structure so that the MLR structure is between the metal layer and the back surface of the semiconductor layer. An inventive light-emitting device can further include a plurality of optical scattering elements arranged within one or more layers of the MLR structure. The scattering elements can scatter laterally-propagating output light to propagate perpendicularly relative to the device exit surface; such scattering can be induced by, e.g., diffraction from scattering elements arranged periodically or quasi-periodically within the MLR structure. The device exit surface of an inventive light-emitting device can include an anti-reflection layer or coating. Near-field proximity of the MLR structure to the active layer, and structural arrangement of the MLR structure, can result in the device exhibiting one or more of: (i) a relatively enhanced Purcell factor, (ii) a relatively increased fraction of output light propagating within a device escape cone, (iii) a relatively reduced mean total number of internal redirections and internal reflections per photon of output light before exiting the device, or (iv) a relatively enhanced photon extraction efficiency.

Objects and advantages pertaining to light-emitting devices may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 6A is a schematic cross-sectional view of another specific example of an inventive light-emitting device; FIG. 6B is a table listing the layer arrangement of the device of FIG. 6A; FIG. 6C is a sine-corrected plot of radiant intensity versus emission angle for the device of FIG. 6A and two conventional reference devices; FIG. 6D is a table of performance parameters of the device of FIG. 6A and the two conventional reference devices.

FIG. 7A is a schematic cross-sectional view of another specific example of an inventive light-emitting device; FIG. 7B is a table listing the layer arrangement of the device of FIG. 7A; FIG. 7C is a sine-corrected plot of radiant intensity versus emission angle for the device of FIG. 7A and two conventional reference devices; FIG. 7D is a table of performance parameters of the device of FIG. 7A and the two conventional reference devices.

Figures 1, 2, 3, 4:
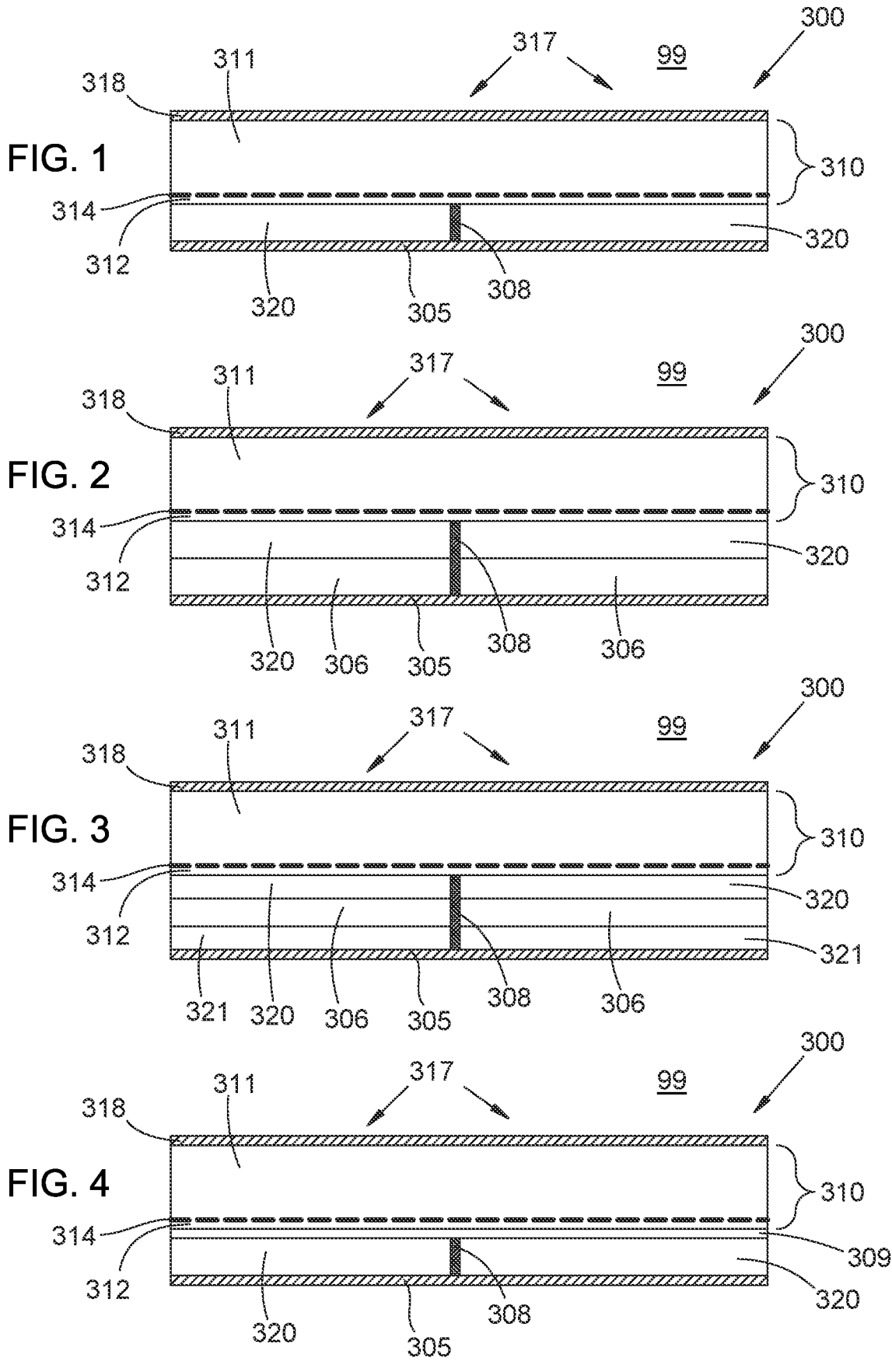
FIGS. 1-4 are schematic cross-sectional views of three general examples of an inventive light-emitting device.

The embodiments depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, the light-emitting devices depicted as having a handful of scattering elements typically have hundreds or thousands of such elements per millimeter; the number of scattering elements is reduced in the drawings for clarity. In addition, the height, depth, or width of each layer or scattering element often can be exaggerated relative to those of other structures, e.g., relative to the thickness of an underlying substrate or a semiconductor layer. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the invention. The detailed description illustrates by way of example, not by way of limitation, the principles of the invention.

Typical light-emitting diodes (LEDs) include one or more light-emitting active layers within a semiconductor diode structure that emit light when driven by an electric current. The back surface of the semiconductor diode structure (and in some instances one or more or all side surfaces) typically includes a reflector that reflects light incident within the semiconductor diode structure to propagate toward the front surface of the diode structure (also referred to herein as the exit surface or escape surface). Many semiconductor materials have relatively large refractive indices (often around 3 or more) which would result in a large fraction of the emitted light being trapped within the semiconductor diode structure by total internal reflection. In some conventional light-emitting diodes texturing (e.g., corrugations, bumps or dimples, or other surface features or roughness) is formed on or attached to the front, exit surface of the semiconductor diode structure. The back-surface reflector in such so-called cavity emitters ensures that nearly all light propagating within the semiconductor diode structure eventually is incident on the front surface. The front-surface texturing serves to spoil total internal reflection at least partly, allowing a portion of the emitted light to escape the semiconductor diode structure through the front surface as device output light, while redirecting other portions propagate to within the semiconductor diode structure in directions that differ from that of a specular reflection from a flat exit surface. Those redirected portions eventually reach the front surface again and have another opportunity to escape by transmission through the front surface. This light recirculation process continues, and each so-called "photon bounce" (i.e., each round trip back and forth between the front and back surfaces through the semiconductor diode structure) within the effective "LED cavity" formed by the back-surface reflector and the front-surface texturing increases the overall probability of that photon escaping through the front surface as device output light.

Figures 10, 11, 12A, 12B:
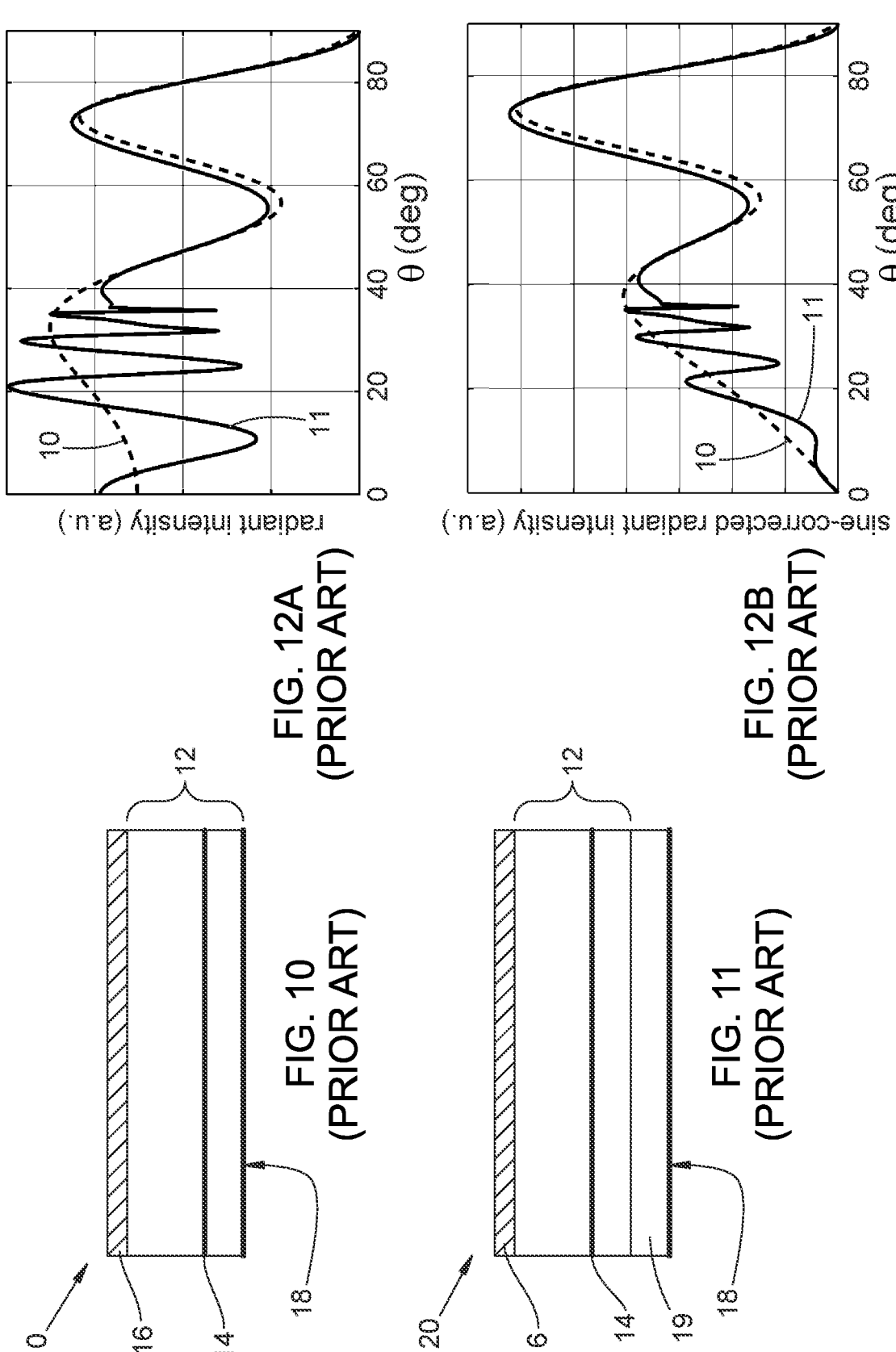
FIGS. 10 and 11 are schematic cross-sectional views of two conventional light-emitting devices.
FIGS. 12A and 12B are plots of radiant intensity (sine-corrected in FIG. 12B) as a function of emission angle for the devices of FIGS. 10 and 11.

One example of a conventional LED cavity emitter 10 is illustrated schematically in FIG. 10 and includes a semiconductor diode structure 12, a light-emitting active layer 14 within the semiconductor diode structure 12, texturing 16 on the front surface of the semiconductor diode structure 12, and a metal reflector 18 on the back surface of the semiconductor diode structure 12. Another example of a conventional LED cavity emitter 20 is illustrated schematically in FIG. 11 and includes a semiconductor diode structure 12, a light-emitting active layer 14 within the semiconductor diode structure 12, texturing 16 on the front surface of the diode structure 12, a dielectric layer 19 on the back surface of the diode structure 12, and a metal reflector 18 on the back surface of the dielectric layer 19. In both FIGS. 10 and 11 the reflector 18 exhibits only specular reflection. FIGS. 12A and 12B are plots of radiant intensity as a function of emission angle relative to the direction normal to the active layer 14 (sine-corrected in FIG. 12B, to account for integration over the full range of azimuthal angles).

In many instances the probability per bounce of a photon being transmitted through the front surface is relatively low, which in turn requires a relatively large number of round trips to achieve a sufficiently high probability of photon extraction (e.g., 10 to 50 bounces to achieve extraction efficiency approaching 90%, depending on the particular materials employed). That relatively high number of round trips or photon bounces in turn requires sufficiently low optical loss per round trip through the semiconductor diode structure (e.g., loss due to absorption by the diode structure, active layer, or reflector materials, or insufficient reflectivity of the reflector). That low-loss requirement in some cases can drive up the cost or complexity of the light-emitting device (e.g.: use of a silver reflector instead of aluminum; use of a multi-layer thin film reflector instead of a metal reflector; or use of higher-purity materials for diode structure, active layer, or reflector), or result in devices with low extraction efficiency (e.g., if low-loss alternatives are unavailable or cost-prohibitive). It is also typically the case that only a relatively small fraction (e.g., less than 13%) of light emitting by the active layer 14 is incident, upon a first encounter with the exit surface, at an angle within an escape cone, and so has a chance to be transmitted rather than internally reflected.

Devices arranged according to FIG. 10 can be "tuned" by selecting a suitable distance between the active layer 14 and the metal layer 18 that results in increased total radiated emission and a higher fraction of emitted light propagating within an escape cone (relative to a so-called semi-infinite half-cavity model, in which no structures are near enough to the active layer 14 to affect its emission characteristics). Devices arranged according to FIG. 10 also tend to have lower extraction efficiency due to unwanted absorption by the metal layer 18. That absorption can be reduced, and extraction efficiency increased, by arranging devices according to FIG. 11 to include the dielectric layer 19. However, devices arranged according to FIG. 11 tend to exhibit decrease total radiative emission and a smaller fraction of emitted light propagating within the escape cone.

For purposes of the present disclosure and appended claims, "incidence angle" and "angle of incidence" of light incident on a surface or interface refers to the angle between the propagation direction of the incident light and a vector normal to the surface or interface. Accordingly, light propagating at normal incidence with respect to a surface would have an incidence angle of 0°, while light propagating near grazing incidence with respect to that surface would have an incidence angle approaching 90°. For purposes of the present disclosure and appended claims, the "critical angle" (designated by $\Theta_C$) for light incident on a surface or interface between media of differing refractive indices refers to the incidence angle, for light propagating within the higher-index medium, above which the light undergoes total internal reflection within the higher-index medium. The critical angle $\Theta_C$ therefore defines an escape cone with respect to a given surface or interface, so that light incident outside the escape cone is totally internally reflected and light incident within the escape cone can be transmitted by refraction.

For purposes of the present disclosure and appended claims, "oblique light", "oblique radiation", "obliquely propagating", "lateral light", "lateral radiation", "laterally propagating", and so forth shall refer to light propagating within a substrate, layer, or diode structure at incidence angles greater than $\Theta_C$ with respect to the front and back surfaces thereof (i.e., outside the escape cone), while "per-pendicular light", "perpendicular radiation", "perpendicu-larly propagating", "vertical light", "vertical radiation", "vertically propagating", and so forth shall refer to light propagating within a substrate or diode structure at inci-dence angles less than $\Theta_C$ with respect to those surfaces (i.e., inside the escape cone), even if not literally perpendicular to the surface or vertical; "normal" shall be reserved to describe light incident at an incidence angle substantially equal to 0°.

For purposes of the present disclosure and appended claims, any arrangement of a layer, surface, substrate, diode structure, or other structure "on," "over," or "against" another such structure shall encompass arrangements with direct contact between the two structures as well as arrange-ments including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" and "substantially transparent" shall exhibit, at the nominal emission vacuum wavelength $\lambda_0$, a level of optical transmission that is sufficiently high, or a level of optical loss (due to absorption, scattering, or other loss mechanism) that is sufficiently low, that the light-emitting device can function within operationally acceptable parameters (e.g., output power or luminance, conversion or extraction efficiency, or other figures-of-merit including those described below).

It would be desirable to provide an inventive light-emitting device that exhibits one or more of (at least relative to one or both of the arrangements of FIG. 10 or 11): (i) enhanced photon extraction efficiency (e.g., 80% or more), (ii) reduced number of photon bounces (e.g., 30 or fewer), (iii) enhanced total radiated emission, (iv) enhanced Purcell factor, or (v) enhanced fraction of emitted light propagating within an escape cone before first encountering an escape surface. Accordingly, an inventive semiconductor light-emitting device 300 that can achieve one or more of those improvements includes a semiconductor diode structure 310 and a multi-layer reflector (MLR) structure 320. Several general examples of inventive devices 300 are illustrated schematically in FIGS. 1 through 4; several specific examples of inventive devices 300 are illustrated schemati-cally in FIGS. 5A through 9D.

The semiconductor diode structure 310 includes first and second doped semiconductor layers 311 and 312, respec-tively, and an active layer 314 between them. In many instances the first semiconductor layer 311 is an n-type semiconductor, and the second semiconductor layer 312 is a p-type semiconductor. The active layer 314 is arranged for emitting output light at a nominal emission vacuum wave-length $\lambda_0$, resulting from electrical current flow through the device 300. The emitted output light propagates within the diode structure 310. The diode structure 310 typically is arranged as a semiconductor light-emitting diode (LED).

The diode structure 310 (and the layers 311/312/314) typi-cally can include one or more doped or undoped III-V, II-VI, or Group IV semiconductor materials or alloys or mixtures thereof. Common materials employed include III-nitride materials (for emission in, e.g., the near-UV and blue portions of the optical spectrum) and III-phosphide materials (for emission in, e.g., the yellow, red, and near-IR portions of the optical spectrum); other one or more suitable mate-rials can be employed. The active layer 314 can be arranged in any suitable way for emitting light in response to elec-trical current flowing through the diode structure 310. The active layer can include, e.g., one or more p-n junctions, one or more quantum wells, one or more multi-quantum wells, or one or more quantum dots. In some examples the nominal emission vacuum wavelength $\lambda_0$ can be greater than about 0.20 μm, greater than about 0.40 μm, greater than about 0.8 μm, less than about 10. μm, less than about 2.5 μm, or less than about 1.0 μm.

The multi-layer reflector (MLR) structure 320 is posi-tioned against a back surface of the second semiconductor layer 312 and includes two or more layers of dielectric materials of two or more different refractive indices. The collective arrangement of the dielectric layers of the MLR structure 320 reflects output light incident thereon from within the second semiconductor layer 312. A common arrangement for the MLR structure is as a distributed Bragg reflector (DBR); other suitable multi-layer reflector arrange-ments can be employed. The second semiconductor layer 312 is sufficiently thin so that the MLR structure 320 is in near-field proximity to the active layer 314 relative to the vacuum wavelength $\lambda_0$. In some examples the distance between the active layer 314 and the MLR structure 320 can be less than about $\lambda_0/n$, less than about $\lambda_0/2n$, less than about $\lambda_0/4n$, or less than about $\lambda_0/10n$, where n is the effective refractive index of the second semiconductor layer 312.

At least a portion of a front surface of the first semicon-ductor layer 311 is arranged as a device exit surface 317 in contact with an external medium 99 (e.g., ambient air or a sapphire substrate). At least a portion of the output light, that propagates perpendicularly within the diode structure 310 relative to the device exit surface 317 and is incident on the device exit surface 317 within the diode structure 310, exits the diode structure 310 as device output light. In some examples the entire front surface of the first semiconductor layer 311 can be arranged as the device exit surface 317. In other examples only a first portion of the front surface of the first semiconductor layer 311 is arranged as the device output surface 317. In such examples, a second portion of the front surface of the first semiconductor layer 311 can be arranged so as to exhibit specular or non-specular internal reflective redirection of output light incident on the front surface from within the diode structure 300; photons redi-rected by those portions can make another round trip through the diode structure 310.

In some examples the light-emitting device 300 can further include a metal layer 305 on a back surface of the MLR structure 320 (i.e., so that the MLR structure 320 is between the metal layer 305 and the back surface of the semiconductor layer 312). In some examples the metal layer 305 can include one or more of aluminum, silver, or gold. Some examples that include a metal layer 305 can also include a substantially transparent dielectric layer 306 between the metal layer 305 and the MLR structure 320 (e.g., as in FIGS. 2 and 3). Such a dielectric layer 306 can include one or more materials among: doped or undoped silicon oxide, nitride, or oxynitride; one or more doped or undoped metal oxides, nitrides, or oxynitrides; one or more optical glasses; or one or more doped or undoped polymers. Some examples that include a dielectric layer 306 can also include an additional MLR structure 321 between the metal layer 305 and the dielectric layer 306 (e.g., as in FIG. 3).

In some instances the metal layer 305 can enhance the overall reflectivity of the MLR structure 320. In many instances the metal layer 305 can serve as an electrical contact to the light-emitting device 300. In such examples, the device 300 can further include one or more electrically conductive vias 308. Each via 308 can be arranged as a localized, circumscribed electrical conduction path through the MLR structure 320 (and the dielectric layer 306 or the additional MLR structure 321, if present) between the metal layer 305 and the second semiconductor layer 312. In some examples that include vias 308, the vias 308 can connect directly to the second semiconductor layer 312 (e.g., as in FIGS. 1-3). In some other examples that include vias 308, the device 300 can include a substantially transparent electrode layer 309 between the MLR structure 320 and the back surface of the second semiconductor layer 312 (e.g., as in FIG. 4); the vias 308 provide an electrical conduction path between the metal layer 305 and the semiconductor layer 312 by being connected to the electrode layer 309, which is in direct contact with the semiconductor layer 312. The transparent electrode layer 309 can include one or more of indium tin oxide (ITO), indium zinc oxide, or one or more other transparent conductive oxides. Some examples that include an electrode layer 309 can also include one or both of a dielectric layer 306 or an additional MLR structure 321.

Any suitable dielectric materials can be employed for forming the MLR structure 320 (and additional MLR structure 321 if present), including one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers. In some examples, the MLR structure 320 (or the additional MLR structure 321 if present) can include layers of titanium oxide or niobium oxide interleaved with layers of silica.

Design or optimization of the diode structure 310 and MLR structure 320 (and one or both of the dielectric layer 306 or additional MLR structure 321, if present) can be performed (by calculation, simulation, or iterative designing/making/testing of prototypes or test devices) based on one or more selected figures-of-merit (FOMs). FOMs that are often considered can include, e.g.: (i) Purcell factor (Pf; relative spontaneous emission rate affected by environment; Pf defines the total emitted power normalized to the emission in homogeneous medium); (ii) total radiated emission (tot. rad. em. or Rad tot; the total (far-field) emitted power of the source that reaches the escape surface); (iii) radiated emission (angle) ($Rad_{CriticalAngle}$; fraction of total radiated emission restricted to a particular escape cone, e.g., 24.2° for GaN-Air or 46.8° for GaN-sapphire); or (iv) radiation efficiency (Rad eff; the ratio Rad tot/Pf; quantifies the ability for the system to radiate power into the escape surface with minimum absorption losses). Instead or in addition, reduction of cost or manufacturing complexity can be employed as an FOM in a design or optimization process. Optimization for one FOM can result in non-optimal values for one or more other FOMs. Note that a device that is not necessarily fully optimized can nevertheless provide acceptable enhancement of one or more FOMs; such partly optimized devices fall within the scope of the present disclosure or appended claims.

Inventive devices 300 arranged according to FIGS. 1-4 can be optimized to exhibit improvement with respect to one or more of the FOMs mentioned above. It is believed that near-field proximity of the MLR structure 320 to the active layer 314 can enhance the spontaneous emission rate, and can alter the spatial distribution of that emission to be directed more perpendicularly than emission without the MLR structure 320 present. Together those effects can result in a larger fraction of emitted light propagating within a specified escape cone. The dielectric layers of the MLR structure 320 are also believed to reduce absorption losses per round trip relative to, e.g., the arrangement of FIG. 10. The multiple layer thicknesses in the MLR structure 320 also provide a larger number of parameters that can be tuned in a given optimization process, providing opportunities for improvements relative to the conventional devices of FIGS. 10 and 11.

Figures 5A, 5B, 5C, 5D:
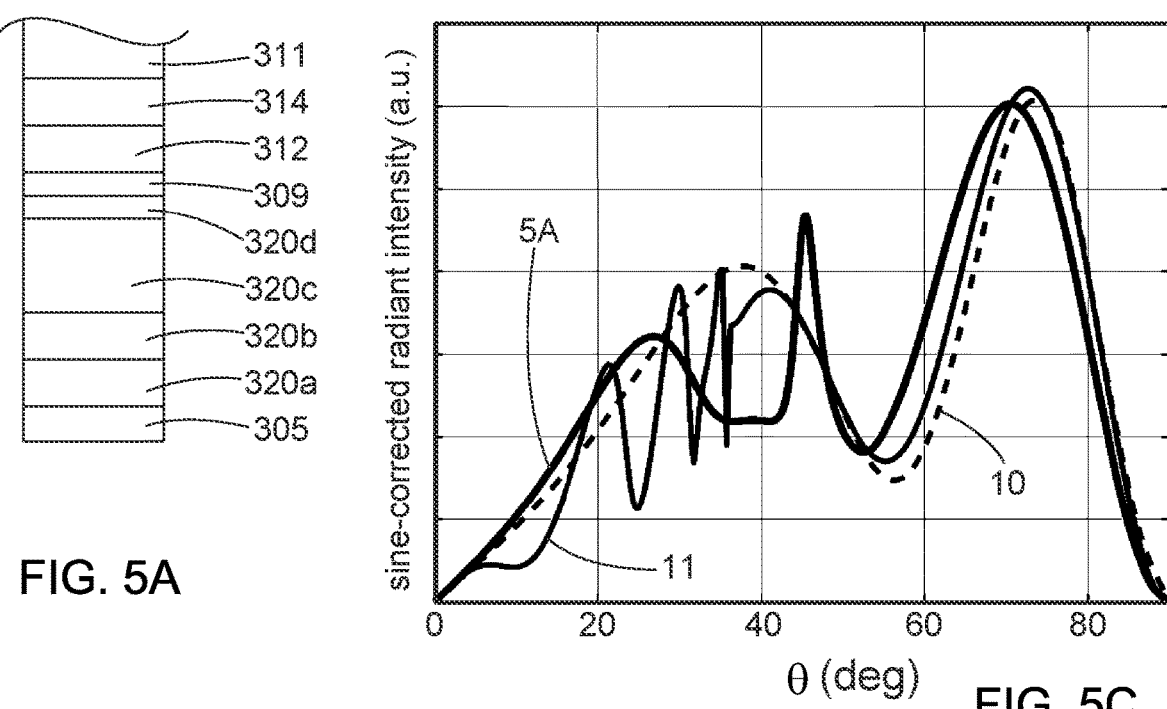
FIG. 5A is a schematic cross-sectional view of a specific example of an inventive light-emitting device.
FIG. 5B is a table listing the layer arrangement of the device of FIG. 5A.
FIG. 5C is a sine-corrected plot of radiant intensity versus emission angle for the device of FIG. 5A and two conventional reference devices.
FIG. 5D is a table of performance parameters of the device of FIG. 5A and the two conventional reference devices.

A layer structure for one specific example of an inventive device 300 is illustrated schematically in FIG. 5A, which includes alternating layers 320a/b/c/d of silica and niobium oxide and is optimized for a nominal emission vacuum wavelength of 450 nm; layer thicknesses and compositions are shown in the table of FIG. 5B. Plots of sine-corrected, angle-dependent radiant intensity are shown in FIG. 5C for the device of FIG. 5A compared to devices arranged according to FIGS. 10 and 11. The device of FIG. 5A exhibits an enhanced fraction of light emitted within the escape cone for a GaN device against an external medium 99 of air, relative to the devices of FIGS. 10 and 11 (ca. 6% and 21% improvement, respectively), and enhanced radiation efficiency relative to the device of FIG. 10 (ca. 1% improvement). Light emitted within the escape cone has the best chance of leaving the device 300 upon first incidence on the escape surface 317, and directing a larger fraction of emitted light to propagate within the escape cone can increase the overall efficiency of the inventive light-emitting device 300.

A layer structure for one specific example of an inventive device 300 is illustrated schematically in FIG. 6A, which includes the MLR structure 320 (alternating layers 320a/b/c/d/e/f/g of silica and niobium oxide), a silica dielectric layer 306, and an additional MLR structure 321 (alternating layers of silica and niobium oxide and a layer of aluminum oxide). The structure of FIG. 6A is optimized for a nominal emission vacuum wavelength of 441 nm; layer thicknesses and compositions are shown in the table of FIG. 6B. Plots of sine-corrected, angle-dependent radiant intensity are shown in FIG. 6C for the device of FIG. 6A compared to devices arranged according to FIGS. 10 and 11. The device of FIG. 6A exhibits an enhanced fraction of light emitted within the escape cone for a GaN device against an external medium 99 of air, relative to the devices of FIGS. 10 and 11 (ca. 36% and 54% improvement, respectively). Light emitted within the escape cone has the best chance of leaving the device 300 upon first incidence on the escape surface 317, and directing a larger fraction of emitted light to propagate within the escape cone can increase the overall efficiency of the inventive light-emitting device 300.

Any of the devices of FIGS. 1-4 can further include a plurality of optical scattering elements arranged within one or more layers of the MLR structure 320. Those scattering elements can be arranged to scatter at least a portion of output light, that propagates laterally within the diode structure 310 relative to the device exit surface 317, to propagate perpendicularly relative to the device exit surface 317. An effect of the scattering elements is to increase the likelihood that light emitted to propagate laterally (i.e., outside the escape cone) would be scattered during a round trip through the diode structure 300 to propagate perpendicularly (i.e., within the escape cone) on a subsequent round trip, thereby increasing the probability of transmission through the exit surface 317 in a smaller median number of round trips. In addition, the presence of the scattering elements provide additional device parameters that can be manipulated to optimize the device 300 (fully or partly) with respect to one or more selected FOMs.

In some examples the scattering elements can include one or more volumes of dielectric material within one or more corresponding layers of the MLR structure 320; the dielectric material of each one of those scattering elements would differ from material of the corresponding layer of the MLR structure with respect to refractive index. In some examples, the MLR structure 320 can include layers of titanium oxide or niobium oxide interleaved with layers of silica, and the scattering elements can include one or both of (i) titanium oxide or niobium oxide elements within one or more of the silica layers, or (ii) silica scattering elements within one or more of the titanium oxide or niobium oxide layers. In some examples the scattering elements can include one or more volumes of metallic material (e.g., aluminum, silver, or gold) within one or more corresponding layers of the MLR structure 320. In some examples the scattering elements can include one or more nano-antennae or one or more meta-atoms or meta-molecules within one or more layers of the MLR structure 320 (e.g., as disclosed in (i) U.S. non-provisional application Ser. No. 17/121,014 entitled "Light-emitting device with internal non-specular light redirection and anti-reflective exit surface" filed Dec. 14, 2020 in the names of Antonio Lopez-Julia, Venkata Ananth Tamma, Aimi Abass, and Philipp Schneider, and (ii) U.S. provisional App. No. 63/197,648 entitled "Light-emitting device with internal non-specular light redirection and position-dependent reflection, transmission, or redirection" filed Jun. 7, 2021 in the names of Antonio Lopez-Julia, Venkata Ananth Tamma, and Aimi Abass; both of said applications are incorporated by reference as if set forth herein in their entireties).

In some examples, size of or spacing between scattering elements can be less than about $\lambda_0/n$, less than about $\lambda_0/2n$, less than about $\lambda_0/4n$, or less than about $\lambda_0/10n$, n being the effective index of the second semiconductor layer 312. In some examples the scattering elements can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers. In some examples the scattering elements can be arranged within one or more corresponding layers of the MLR structure 320 as a corresponding periodic array within the corresponding layer of the MLR structure 320; such an array can be of any suitable type or arrangement, e.g., a rectangular, hexagonal, or trigonal array. In other examples the scattering elements can be arranged within one or more corresponding layers of the MLR structure 320 in an irregular or aperiodic arrangement. Any of those arrangements, or other suitable arrangements of scattering elements arranged within one or more layers of an MLR structure 320, can be employed, optimized (fully or partly) for any one or more suitable FOMs.

In the example of FIG. 7A, the layers 320a-320j include layers of silica and titanium oxide. Scattering elements are arranged in the mixed titanium oxide and silica layers 320b and 320f as 60 nm substantially square titanium oxide elements arranged on a 100 nm grid within a silica layer. A dielectric layer 306 of silica separated the silver metal layer 305 from the MLR structure 320. The device of FIG. 7A is optimized for a nominal emission vacuum wavelength of 440 nm; layer thicknesses and compositions are shown in the table of FIG. 7B. Plots of sine-corrected, angle-dependent radiant intensity are shown in FIG. 7C for the device of FIG. 7A compared to devices arranged according to FIGS. 10 and 11. The device of FIG. 7A exhibits an enhanced fraction of light emitted within the escape cone for a GaN device against an external medium 99 of air, relative to the devices of FIGS. 10 and 11 (ca. 50% and 43% improvement, respectively), enhanced total radiated emission relative to the devices of FIGS. 10 and 11 (ca. 1% and 3.6% improvement, respectively), and enhanced radiation efficiency relative to the device of FIG. 10 (ca. 2% improvement).

Figures 8A, 8B, 8C, 8D:
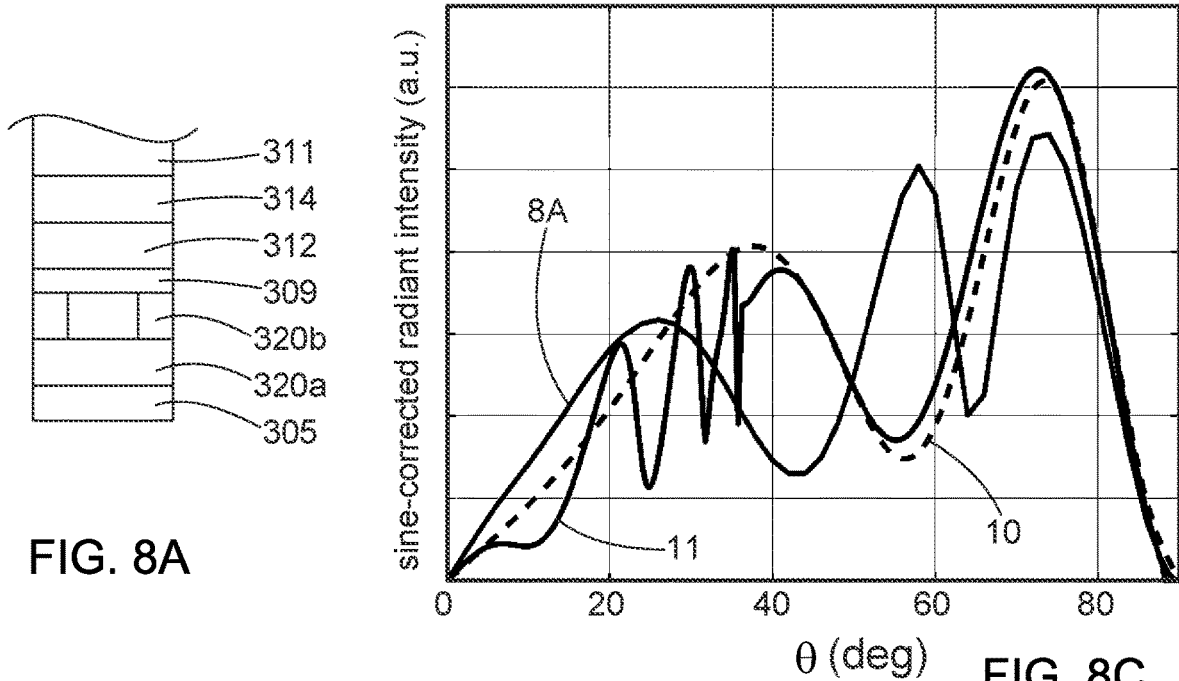
FIG. 8A is a schematic cross-sectional view of a specific example of an inventive light-emitting device.
FIG. 8B is a table listing the layer arrangement of the device of FIG. 8A.
FIG. 8C is a sine-corrected plot of radiant intensity versus emission angle for the device of FIG. 8A and two conventional reference devices.
FIG. 8D is a table of performance parameters of the device of FIG. 8A and the two conventional reference devices.

In the example of FIG. 8A, the MLR structure 320 includes a titanium oxide layer 320a and a mixed titanium oxide and silica layer 320b. The scattering elements are arranged in the mixed titanium oxide and silica layer 320b as 162 nm substantially cylindrical silica elements arranged on a 210 nm grid within a titanium oxide layer. The device of FIG. 8A is optimized for a nominal emission vacuum wavelength of 450 nm; layer thicknesses and compositions are shown in the table of FIG. 8B. Plots of sine-corrected, angle-dependent radiant intensity are shown in FIG. 8C for the device of FIG. 8A compared to devices arranged according to FIGS. 10 and 11. The device of FIG. 8A exhibits an enhanced fraction of light emitted within the escape cone for a GaN device against an external medium 99 of air, relative to the devices of FIGS. 10 and 11 (ca. 36% and 55% improvement, respectively).

Figures 9A, 9B, 9C, 9D:
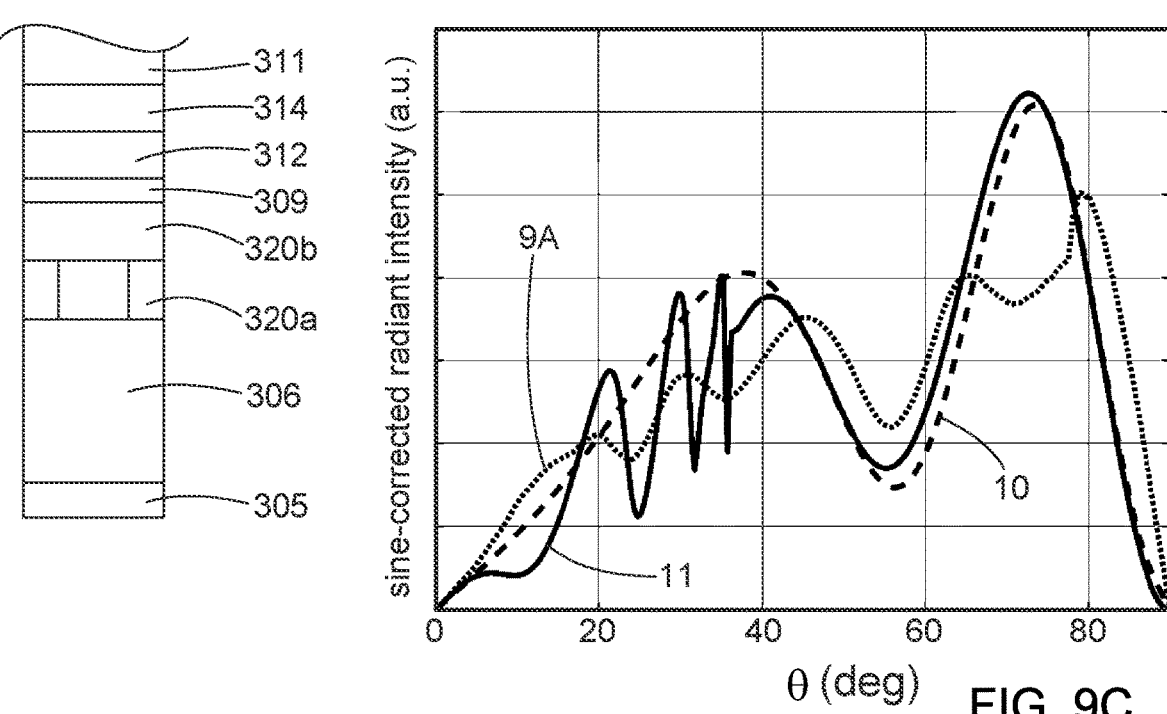
FIG. 9A is a schematic cross-sectional view of a specific example of an inventive light-emitting device.
FIG. 9B is a table listing the layer arrangement of the device of FIG. 9A.
FIG. 9C is a sine-corrected plot of radiant intensity versus emission angle for the device of FIG. 9A and two conventional reference devices.
FIG. 9D is a table of performance parameters of the device of FIG. 9A and the two conventional reference devices.

In the example of FIG. 9A, the MLR structure 320 includes a mixed titanium oxide and silica layer 320a and a titanium oxide layer 320b. The scattering elements are arranged in the mixed titanium oxide and silica layer 320a as 140 nm substantially cylindrical silica elements arranged on a 200 nm grid within a titanium oxide layer. The device of FIG. 9A is optimized for a nominal emission vacuum wavelength of 450 nm; layer thicknesses and compositions are shown in the table of FIG. 9B. Plots of sine-corrected, angle-dependent radiant intensity are shown in FIG. 9C for the device of FIG. 9A compared to devices arranged according to FIGS. 10 and 11. The device of FIG. 9A exhibits an enhanced fraction of light emitted within the escape cone for a GaN device against an external medium 99 of air, relative to the devices of FIGS. 10 and 11 (ca. 14% and 29% improvement, respectively), enhanced total radiated emission relative to the device of FIG. 11 (ca. 1% improvement), and enhanced radiation efficiency relative to the device of FIG. 10 (ca. 0.2% improvement).

More generally, in some examples of fully or partly optimized inventive light-emitting devices 300, near-field proximity of the MLR structure 320 to the active layer 314, and structural arrangement of the MLR structure 320, can result in the device 300 exhibiting a Purcell factor that is greater than about 1.01, greater than about 1.02, greater than about 1.03, greater than about 1.04, greater than about 1.05, or even higher. More generally, in some examples of fully or partly optimized inventive light-emitting devices 300, near-field proximity of the MLR structure 320 to the active layer 314, and structural arrangement of the MLR structure 320 (and one or both of a dielectric layer 306 or an additional MLR structure 321, if present), can result in a fraction of output light propagating within the diode structure 310 toward the front surface of the first semiconductor layer 311, within an escape cone defined by an interface between the first semiconductor layer 311 and an external medium 99 (e.g., ambient air), that is greater than about 0.13, greater than about 0.14, greater than about 0.15, greater than about 0.16, greater than about 0.17, or even higher. More generally, in some examples of fully or partly optimized inventive light-emitting devices 300, near-field proximity of the MLR structure 320 to the active layer 314, and structural arrangement of the MLR structure 320 (and one or both of a dielectric layer 306 or an additional MLR structure 321, if present), can result in a fraction of output light propagating within the diode structure 310 toward the front surface of the first semiconductor layer 311, within an escape cone defined by an interface between the first semiconductor layer 311 and a substantially transparent solid medium 99 (e.g., silicone or sapphire), that is greater than about 0.35, greater than about 0.40, or even higher.

In some examples, one or both of the MLR structure 320 or the device exit surface 317 (and one or both of a dielectric layer 306 or an additional MLR structure 321, if present) can be arranged so that the device 300 exhibits a mean total number of internal redirections and internal reflections per photon of output light, after being emitted by the active layer 314 and before exiting the diode structure 310 through the device exit surface 317, that is less than 30, less than 20, less than 10, or less than 5. In some examples, the light-emitting device 300 can exhibit a photon extraction efficiency that is greater than about 80.%, greater than about 90.%, or greater than about 95.%. In some examples, the MLR structure 320 (and one or both of a dielectric layer 306 or an additional MLR structure 321, if present), or the MLR structure 320 with a metal layer 305 on its back surface, can exhibit reflectivity that is greater than about 80.%, greater than about 85.%, greater than about 90.%, or greater than about 95.%. In some examples, the MLR structure 320 (and one or both of a dielectric layer 306 or an additional MLR structure 321, if present), or the MLR structure 320 with a metal layer 305 on its back surface, can exhibit optical loss per pass for output light incident thereon that is less than about 20.%, less than about 10.%, less than about 5.%, less than about 2.0%, or less than about 1.0%.

In some examples, arrangement of the device exit surface 317 can include an external medium 99 in direct contact with at least a portion of the front surface of the first semiconductor layer 311. In some other examples, the device exit surface 317 can include an anti-reflection layer or coating 318 so that the device exit surface 317 against the external medium 99 exhibits reduced reflectivity, for output light perpendicularly incident thereon from within the diode structure 310, relative to Fresnel reflectivity of an interface between the front surface of the first semiconductor layer 311 and the external medium 99 in the absence of the front-surface coating or layer 318. In some examples the anti-reflection layer or coating 318 can include a single-layer quarter-wave dielectric thin film or a multi-layer dielectric thin film; in some examples the anti-reflection layer or coating 318 can include an array of nano-antennae, meta-atoms, or meta-molecules; in some examples the anti-reflection layer or coating 318 can include a moth-eye structure or an index-gradient film. In some examples, reflectivity of the device exit surface 317 against the external medium 99 can be less than about 10.%, less than about 5.%, less than about 2.0%, less than about 1.0%, or less than about 0.5%. In some examples, the anti-reflection layer or coating can include one or more materials among: doped or undoped silicon oxide, nitride, or oxynitride; one or more doped or undoped metal oxides, nitrides, or oxynitrides; one or more optical glasses; or one or more doped or undoped polymers.

In some examples, the external medium 99 can be substantially solid and can include one or more materials among: one or more metal or semiconductor oxides, oxynitrides, or nitrides, one or more doped or undoped silicones, or one or more doped or undoped polymers; in some other examples the external medium 99 can comprise vacuum, air, a gaseous medium, or a liquid medium.

In some examples, a method for making an inventive light-emitting device 300 can include: (A) forming the first semiconductor layer 311, the active layer 314, and the second semiconductor layer 312; and (B) forming the MLR structure 320 on the back surface of the second semiconductor layer 312. In some examples, a method for making an inventive light-emitting device 300 can include: (A) forming the first semiconductor layer 311, the active layer 314, and the second semiconductor layer 312; (B) forming the MLR structure 320 on the back surface of the second semiconductor layer 312; and (C) forming the metal layer 305 on the back surface of the MLR structure 320. In some of those examples, the method can further include forming the dielectric layer 306 on the back surface of the MLR structure 320 before forming the metal layer 305; in some of those examples the method can further include forming the additional MLR structure 321 on the dielectric layer 306 before forming the metal layer 305. In some examples, a method for making an inventive light-emitting device 300 can include: (A) forming the first semiconductor layer 311, the active layer 314, and the second semiconductor layer 312; (B) forming the MLR structure 320 on the back surface of the second semiconductor layer 312; and (C) forming the plurality of optical scattering elements within one or more layers of the MLR structure 320. In some examples, a method for making an inventive light-emitting device 300 can include: (A) forming the first semiconductor layer 311, the active layer 314, and the second semiconductor layer 312; (B) forming the MLR structure 320 on the back surface of the second semiconductor layer 312; and (C) forming the anti-reflection layer or coating 318 on the device exit surface 317. Any suitable one or more material processing techniques or methodologies can be employed, including but not limited to beam or vapor deposition, lithography of any type, epitaxy, nanoimprinting, film or layer growth, and so forth.

A method for operating an inventive light-emitting device 300 can include supplying to the light-emitting device 300 electrical power so that the light-emitting device 300 emits device output light from the device exit surface 317 to propagate in an external medium 99 against the device exit surface 317.

In addition to the preceding, the following example embodiments fall within the scope of the present disclosure or appended claims:

Example 1. A semiconductor light-emitting device comprising: (a) a semiconductor diode structure including first and second doped semiconductor layers and an active layer between a back surface of the first semiconductor layer and a front surface of the second semiconductor layer, the active layer being arranged for emitting output light, resulting from electrical current flow through the device, at a nominal emission vacuum wavelength $\lambda_0$ to propagate within the diode structure; and (b) a multi-layer reflector (MLR) structure positioned against a back surface of the second semiconductor layer, the MLR structure including two or more layers of dielectric materials of two or more different refractive indices arranged collectively so as to reflect output light incident thereon from within the second semiconductor layer, the second semiconductor layer being sufficiently thin so that the MLR structure is in near-field proximity to the active layer relative to the vacuum wavelength $\lambda_0$, (c) at least a portion of a front surface of the first semiconductor layer being arranged as a device exit surface through which at least a portion of the output light, that propagates perpendicularly within the diode structure relative to the device exit surface and is incident on the device exit surface within the diode structure, exits the diode structure as device output light.

Example 2. The device of Example 1 further comprising a metal layer on a back surface of the MLR structure so that the MLR structure is between the metal layer and the back surface of the semiconductor layer.

Example 3. The device of Example 2 further comprising one or more electrically conductive vias, each via being arranged as a localized, circumscribed electrical conduction path through the MLR structure between the metal layer and the second semiconductor layer.

Example 4. The device of any one of Examples 2 or 3, the metal layer including one or more of aluminum, silver, or gold.

Example 5. The device of any one of Examples 2 through 4 further comprising a substantially transparent dielectric layer between the metal layer and the MLR structure.

Example 6. The device of Example 5, the dielectric layer having a refractive index less than an average refractive index of the MLR structure.

Example 7. The device of any one of Examples 5 or 6, the dielectric layer including one or more materials among: doped or undoped silicon oxide, nitride, or oxynitride; one or more doped or undoped metal oxides, nitrides, or oxynitrides; one or more optical glasses; or one or more doped or undoped polymers.

Example 8. The device of any one of Examples 1 through 7 further comprising a substantially transparent electrode layer between the MLR structure and the back surface of the second semiconductor layer.

Example 9. The device of Example 8 further comprising multiple electrically conductive vias, each via being arranged as a localized, circumscribed electrical conduction path through the MLR structure between the metal layer and the transparent electrode layer.

Example 10. The device of any one of Examples 8 or 9, the transparent electrode layer including one or more of indium tin oxide, indium zinc oxide, or one or more other transparent conductive oxides.

Example 11. The device of any one of Examples 1 through 10, distance between the active layer and the MLR structure being less than about $\lambda_0/n$, less than about $\lambda_0/2n$, less than about $\lambda_0/4n$, or less than about $\lambda_0/10n$, n being the effective refractive index of the second semiconductor layer.

Example 12. The device of any one of Examples 1 through 11, $\lambda_0$ being greater than about 0.20 μm, greater than about 0.4 μm, greater than about 0.8 μm, less than about 10. μm, less than about 2.5 μm, or less than about 1.0 μm.

Example 13. The device of any one of Examples 1 through 12, the MLR structure being arranged as a distributed Bragg reflector (DBR).

Example 14. The device of any one of Examples 1 through 13, the MLR structure including one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 15. The device of any one of Examples 1 through 14, the MLR structure including layers of titanium oxide or niobium oxide interleaved with layers of silica.

Example 16. The device of any one of Examples 5 through 15 further comprising an additional multi-layer reflector (MLR) structure between the metal layer and the dielectric layer.

Example 17. The device of Example 16, the dielectric layer having a refractive index less than an average refractive index of the additional MLR structure.

Example 18. The device of any one of Examples 16 or 17, the additional MLR structure being arranged as a distributed Bragg reflector (DBR).

Example 19. The device of any one of Examples 16 through 18, the additional MLR structure including one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 20. The device of any one of Examples 16 through 19, the additional MLR structure including layers of titanium oxide or niobium oxide interleaved with layers of silica.

Example 21. The device of any one of Examples 1 through 20 further comprising a plurality of optical scattering elements arranged within one or more layers of the MLR structure so as to scatter at least a portion of output light, that propagates laterally within the diode structure relative to the device exit surface, to propagate perpendicularly relative to the device exit surface.

Example 22. The device of Example 21, the scattering elements including one or more volumes of dielectric material within one or more corresponding layers of the MLR structure, the dielectric material of each one of those scattering elements differing from material of the corresponding layer of the MLR structure with respect to refractive index.

Example 23. The device of any one of Examples 21 or 22, the scattering elements including one or more volumes of metallic material within one or more corresponding layers of the MLR structure.

Example 24. The device of any one of Examples 21 through 23, the scattering elements including one or more nano-antennae or one or more meta-atoms or meta-molecules within one or more layers of the MLR structure.

Example 25. The device of any one of Examples 21 through 24, size of or spacing between scattering elements being less than about $\lambda_0/n$, less than about $\lambda_0/2n$, less than about $\lambda_0/4n$, or less than about $\lambda_0/10n$, n being the effective refractive index of the second semiconductor layer.

Example 26. The device of any one of Examples 21 through 25, the scattering elements including one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 27. The device of any one of Examples 21 through 26, the MLR structure including layers of titanium oxide or niobium oxide interleaved with layers of silica, and the scattering elements including one or both of (i) titanium oxide or niobium oxide elements within one or more of the silica layers, or (ii) silica scattering elements within one or more of the titanium oxide or niobium oxide layers.

Example 28. The device of any one of Examples 21 through 27, the scattering elements being arranged within one or more corresponding layers of the MLR structure as a corresponding periodic array within the corresponding layer of the MLR structure.

Example 29. The device of Example 28, the one or more periodic arrays including one or more of a rectangular, hexagonal, or trigonal array.

Example 30. The device of any one of Examples 21 through 29, the scattering elements being arranged within one or more corresponding layers of the MLR structure in an irregular or aperiodic arrangement.

Example 31. The device of any one of Examples 1 through 30, near-field proximity of the MLR structure to the active layer, and structural arrangement of the MLR structure, resulting in the device exhibiting a Purcell factor that is greater than about 1.01, greater than about 1.02, greater than about 1.03, greater than about 1.04, or greater than about 1.05.

Example 32. The device of any one of Examples 1 through 31, near-field proximity of the MLR structure to the active layer, and structural arrangement of the MLR structure, resulting in a fraction of output light propagating within the diode structure toward the front surface of the first semiconductor layer, within an escape cone defined by an interface between the first semiconductor layer and an external medium against the front surface thereof, that is greater than about 0.13, greater than about 0.14, greater than about 0.15, greater than about 0.16, or greater than about 0.17.

Example 33. The device of Example 32, the external medium comprising ambient air.

Example 34. The device of any one of Examples 1 through 33, near-field proximity of the MLR structure to the active layer, and structural arrangement of the MLR structure, resulting in a fraction of output light propagating within the diode structure toward the front surface of the first semiconductor layer, within an escape cone defined by an interface between the first semiconductor layer and a substantially transparent solid medium against the front surface thereof, that is greater than about 0.35 or greater than about 0.40.

Example 35. The device of any one of Examples 1 through 34, one or both of the MLR structure or the device exit surface being arranged so that the device exhibits a mean total number of internal redirections and internal reflections per photon of output light, after being emitted by the active layer and before exiting the diode structure through the device exit surface, that is less than 30, less than 20, less than 10, or less than 5.

Example 36. The device of any one of Examples 1 through 35, the light-emitting device exhibiting a photon extraction efficiency that is greater than about 80.%, greater than about 90.%, or greater than about 95.%.

Example 37. The device of any one of Examples 1 through 36, the MLR structure, or the MLR structure with a metal layer on a back surface thereof, exhibiting reflectivity that is greater than about 80.%, greater than about 85.%, greater than about 90.%, or greater than about 95.%.

Example 38. The device of any one of Examples 1 through 37, the MLR structure, or the MLR structure with a metal layer on a back surface thereof, exhibiting optical loss per pass for output light incident thereon that is less than about 20.%, less than about 10.%, less than about 5.%, less than about 2.0%, or less than about 1.0%.

Example 39. The device of any one of Examples 1 through 38, wherein arrangement of the device exit surface includes an external medium in direct contact with at least a portion of the front surface of the first semiconductor layer.

Example 40. The device of any one of Examples 1 through 38, the device exit surface including an anti-reflection layer or coating so that the device exit surface against an external medium exhibits reflectivity for output light perpendicularly incident thereon from within the diode structure that is less than Fresnel reflectivity of an interface between the front surface of the first semiconductor layer and the external medium without the front-surface coating or layer.

Example 41. The device of Example 40, the anti-reflection layer or coating including a single-layer quarter-wave dielectric thin film or a multi-layer dielectric thin film.

Example 42. The device of Example 40, the anti-reflection layer or coating including an array of nano-antennae, meta-atoms, or meta-molecules.

Example 43. The device of Example 40, the anti-reflection layer or coating including a moth-eye structure or an index-gradient film.

Example 44. The device of any one of Examples 40 through 43, reflectivity of the device exit surface against the external medium being less than about 10.%, less than about 5.%, less than about 2.0%, less than about 1.0%, or less than about 0.5%.

Example 45. The device of any one of Examples 40 through 44, the anti-reflection layer or coating including one or more materials among: doped or undoped silicon oxide, nitride, or oxynitride; one or more doped or undoped metal oxides, nitrides, or oxynitrides; one or more optical glasses; or one or more doped or undoped polymers.

Example 46. The device of any one of Examples 40 through 45, the front surface of the diode structure being positioned against the external medium, the external medium being substantially solid and including one or more materials among: one or more metal or semiconductor oxides, oxynitrides, or nitrides, one or more doped or undoped silicones, or one or more doped or undoped polymers.

Example 47. The device of any one of Examples 40 through 45, the external medium comprising vacuum, air, a gaseous medium, or a liquid medium.

Example 48. The device of any one of Examples 1 through 47, the entire front surface of the first semiconductor layer being arranged as the device exit surface.

Example 49. The device of any one of Examples 1 through 47, only a first portion of the front surface of the first semiconductor layer being arranged as the device output surface, and a second portion of the front surface of the first semiconductor layer being arranged so as to exhibit specular or non-specular internal reflective redirection of output light incident on the front surface of the first semiconductor layer from within the diode structure.

Example 50. The device of any one of Examples 1 through 49, the semiconductor diode structure comprising a semiconductor light-emitting diode.

Example 51. The device of any one of Examples 1 through 50, the diode structure including one or more doped or undoped III-V, II-VI, or Group IV semiconductor materials or alloys or mixtures thereof.

Example 52. The device of any one of Examples 1 through 51, the active layer including one or more doped or undoped III-V, II-VI, or Group IV semiconductor materials or alloys or mixtures thereof.

Example 53. The device of any one of Examples 1 through 52, the active layer including one or more p-n junctions, one or more quantum wells, one or more multi-quantum wells, or one or more quantum dots.

Example 54. A method for making the light-emitting device of any one of Examples 1 through 53, the method comprising: (A) forming the first semiconductor layer, the active layer, and the second semiconductor layer; and (B) forming the MLR structure on the back surface of the second semiconductor layer.

Example 55. A method for making the light-emitting device of any one of Examples 2 through 53, the method comprising: (A) forming the first semiconductor layer, the active layer, and the second semiconductor layer; (B) forming the MLR structure on the back surface of the second semiconductor layer; and (C) forming the metal layer on the back surface of the MLR structure.

Example 56. A method for making the light-emitting device of any one of Examples 5 through 53, the method comprising: (A) forming the first semiconductor layer, the active layer, and the second semiconductor layer; (B) forming the MLR structure on the back surface of the second semiconductor layer; (C) forming the dielectric layer on the back surface of the MLR structure; and (D) forming the metal layer on the back surface of the MLR structure.

Example 57. A method for making the light-emitting device of any one of Examples 16 through 53, the method comprising: (A) forming the first semiconductor layer, the active layer, and the second semiconductor layer; (B) forming the MLR structure on the back surface of the second semiconductor layer; (C) forming the dielectric layer on the back surface of the MLR structure; (D) forming the additional MLR structure on the dielectric layer; and (E) forming the metal layer on the additional MLR structure.

Example 58. A method for making the light-emitting device of any one of Examples 21 through 53, the method comprising: (A) forming the first semiconductor layer, the active layer, and the second semiconductor layer; (B) forming the MLR structure on the back surface of the second semiconductor layer; and (C) forming the plurality of optical scattering elements within one or more layers of the MLR structure.

Example 59. A method for making the light-emitting device of any one of Examples 40 through 53, the method comprising: (A) forming the first semiconductor layer, the active layer, and the second semiconductor layer; (B) forming the MLR structure on the back surface of the second semiconductor layer; and (C) forming the anti-reflection layer or coating on the device exit surface.

Example 60. A method for operating the light-emitting device of any one of Examples 1 through 53, the method comprising supplying to the light-emitting device electrical power so that the light-emitting device emits device output light from the device exit surface to propagate in an external medium against the device exit surface.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device comprising:
a semiconductor diode structure including first and second doped semiconductor layers and an active layer between a back surface of the first doped semiconductor layer and a front surface of the second doped semiconductor layer, the active layer being arranged for emitting output light, resulting from electrical current flow through the semiconductor light-emitting device, at a nominal emission vacuum wavelength $\lambda_0$ to propagate within the semiconductor diode structure, at least a portion of a front surface of the first doped semiconductor layer being arranged as a device exit surface through which at least a portion of the output light, that propagates perpendicularly within the semiconductor diode structure relative to the device exit surface and is incident on the device exit surface within the semiconductor diode structure, exits the semiconductor diode structure as device output light;

a multi-layer reflector (MLR) structure positioned against a back surface of the second doped semiconductor layer, the MLR structure including two or more layers of dielectric materials of two or more different refractive indices arranged collectively so as to reflect output light incident thereon from within the second doped semiconductor layer, the second doped semiconductor layer being sufficiently thin so that the MLR structure is in near-field proximity to the active layer relative to the vacuum wavelength $\lambda_0$; and a plurality of optical scattering elements arranged within one or more layers of the MLR structure so as to scatter at least a portion of output light, that propagates laterally within the semiconductor diode structure relative to the device exit surface, to propagate perpendicularly relative to the device exit surface, wherein no scattering element extends entirely through the MLR structure.

2. The semiconductor light-emitting device of claim 1 further comprising a metal layer on a back surface of the MLR structure so that the MLR structure is between the metal layer and the back surface of the second doped semiconductor layer.

3. The semiconductor light-emitting device of claim 2 further comprising a substantially transparent dielectric layer between the metal layer and the MLR structure, the dielectric layer having a refractive index less than an average refractive index of the MLR structure.

4. The semiconductor light-emitting device of claim 3 further comprising an additional multi-layer reflector (MLR) structure between the metal layer and the dielectric layer, the dielectric layer having a refractive index less than an average refractive index of the additional MLR structure.

5. The semiconductor light-emitting device of claim 1 further comprising a substantially transparent electrode layer between the MLR structure and the back surface of the second doped semiconductor layer.

6. The semiconductor light-emitting device of claim 1 further comprising one or more electrically conductive vias, each via being arranged as a localized, circumscribed electrical conduction path through the MLR structure.

7. The semiconductor light-emitting device of claim 1, distance between the active layer and the MLR structure being less than about $\lambda_0/n$, n being the effective refractive index of the second doped semiconductor layer.

8. The semiconductor light-emitting device of claim 1, the scattering elements including (i) one or more volumes of dielectric material within one or more corresponding layers of the MLR structure, the dielectric material of each one of those scattering elements differing from material of the corresponding layer of the MLR structure with respect to refractive index, (ii) one or more volumes of metallic material within one or more corresponding layers of the MLR structure, or (iii) one or more nano-antennae or one or more meta-atoms or meta-molecules within one or more layers of the MLR structure.

9. The semiconductor light-emitting device of claim 1, the scattering elements including one or more nano-antennae or one or more meta-atoms or meta-molecules within one or more layers of the MLR structure, size of or spacing between scattering elements being less than about $\lambda_0/n$, n being the effective refractive index of the second doped semiconductor layer.

10. The semiconductor light-emitting device of claim 1, the scattering elements being arranged within one or more corresponding layers of the MLR structure either (i) as a corresponding periodic array within the corresponding layer of the MLR structure, or (ii) in an irregular or aperiodic arrangement.

11. The semiconductor light-emitting device of claim 1, near-field proximity of the MLR structure to the active layer, and structural arrangement of the MLR structure or scattering elements, resulting in the semiconductor light-emitting device exhibiting a Purcell factor that is greater than about 1.01.

12. The semiconductor light-emitting device of claim 1, near-field proximity of the MLR structure to the active layer, and structural arrangement of the MLR structure or scattering elements, resulting in a fraction of output light propagating within the semiconductor diode structure toward the front surface of the first doped semiconductor layer, within an escape cone defined by an interface between the first doped semiconductor layer and an external medium of ambient air against the front surface thereof, that is greater than about 0.13.

13. The semiconductor light-emitting device of claim 1, near-field proximity of the MLR structure to the active layer, and structural arrangement of the MLR structure or scattering elements, resulting in a fraction of output light propagating within the semiconductor diode structure toward the front surface of the first doped semiconductor layer, within an escape cone defined by an interface between the first doped semiconductor layer and a substantially transparent solid medium against the front surface thereof, that is greater than about 0.35.

14. The semiconductor light-emitting device of claim 1, the semiconductor light-emitting device exhibiting a photon extraction efficiency that is greater than about 80%.

15. The semiconductor light-emitting device of claim 1, the device exit surface including an anti-reflection layer or coating so that the device exit surface against an external medium exhibits reflectivity for output light perpendicularly incident thereon from within the semiconductor diode structure that is less than Fresnel reflectivity of an interface between the front surface of the first doped semiconductor layer and the external medium without the front-surface coating or layer.

16. The semiconductor light-emitting device of claim 1, the entire front surface of the first doped semiconductor layer being arranged as the device exit surface.

17. The semiconductor light-emitting device of claim 1, only a first portion of the front surface of the first doped semiconductor layer being arranged as the device exit surface, and a second portion of the front surface of the first doped semiconductor layer being arranged so as to exhibit specular or non-specular internal reflective redirection of output light incident on the front surface of the first doped semiconductor layer from within the semiconductor diode structure.

18. A method for making the semiconductor light-emitting device of claim 1, the method comprising: (A) forming the first doped semiconductor layer, the active layer, and the second doped semiconductor layer; and (B) forming the MLR structure and the scattering elements therein on the back surface of the second doped semiconductor layer.

19. A method for operating the semiconductor light-emitting device of claim 1, the method comprising supplying to the semiconductor light-emitting device electrical power so that the semiconductor light-emitting device emits device output light from the device exit surface to propagate in an external medium against the device exit surface.

20. The semiconductor light-emitting device of claim 1 wherein at least one layer of the MLR structure includes no scattering element or portion thereof.

* * * * *